US008408262B2

(12) United States Patent
Guo et al.

(10) Patent No.: US 8,408,262 B2
(45) Date of Patent: Apr. 2, 2013

(54) ADAPTIVE CHUCK FOR PLANAR BONDING BETWEEN SUBSTRATES

(75) Inventors: Dechao Guo, Hopewell Junction, NY (US); Fei Liu, Yorktown Heights, NY (US); Leathen Shi, Yorktown Heights, NY (US); Keith Kwong Hon Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 12/575,968

(22) Filed: Oct. 8, 2009

(65) Prior Publication Data

US 2011/0083786 A1   Apr. 14, 2011

(51) Int. Cl.
*B32B 41/00* (2006.01)
(52) U.S. Cl. ........ 156/358; 156/360; 156/367; 156/351; 361/233; 361/234
(58) Field of Classification Search .................... 156/64, 156/358, 360; 361/234, 233
See application file for complete search history.

(56) References Cited

U.S. PATENT DOCUMENTS

| | | | |
|---|---|---|---|
| 4,692,836 A * | 9/1987 | Suzuki ........................ | 361/234 |
| 7,142,406 B2 | 11/2006 | Kwon | |
| 7,199,994 B1 * | 4/2007 | Levinson et al. ............. | 361/234 |
| 7,394,960 B2 | 7/2008 | Ohtake | |
| 2002/0044864 A1 * | 4/2002 | Hyakudomi ................... | 414/784 |
| 2003/0067734 A1 | 4/2003 | Nakano | |
| 2004/0179323 A1 * | 9/2004 | Litman et al. ................. | 361/234 |
| 2005/0087939 A1 * | 4/2005 | Caldwell et al. .............. | 279/128 |
| 2007/0151673 A1 * | 7/2007 | Kim .............................. | 156/556 |
| 2007/0236857 A1 * | 10/2007 | Lin et al. ....................... | 361/234 |
| 2008/0239614 A1 * | 10/2008 | Blake et al. .................... | 361/234 |

OTHER PUBLICATIONS

"Electrostatic Chuck" Idonus: Innovations for Microsystem Fabrication, http://www.idonus.com/index.php?menu=products&submenu=electrostatic_chuck, Oct. 8, 2008.

* cited by examiner

*Primary Examiner* — George Koch
(74) *Attorney, Agent, or Firm* — Scully, Scott, Murphy & Presser, P.C.

(57) ABSTRACT

An electrostatic chuck includes an array of independently biased conductive chuck elements, an array of sensor-conductor assemblies, and/or a combination of an array of sensor-conductor assemblies and at least one motorized chuck. Conductive chuck elements, either standing alone or embedded in a sensor-conductor assembly, are independently biased electrostatically to compensate for bowing and/or warping of a substrate thereupon so that the substrate can be bonded with a planar surface. A single electrostatic chuck can be employed to reduce the bowing and warping of one of the two substrates to be bonded, or two electrostatic chucks can be employed to minimize the bowing and warping of two substrates to be bonded.

20 Claims, 9 Drawing Sheets

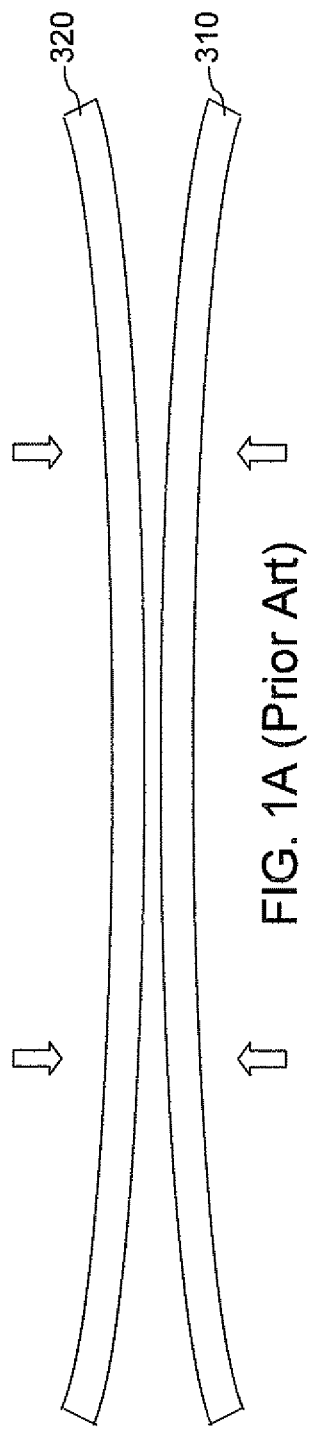
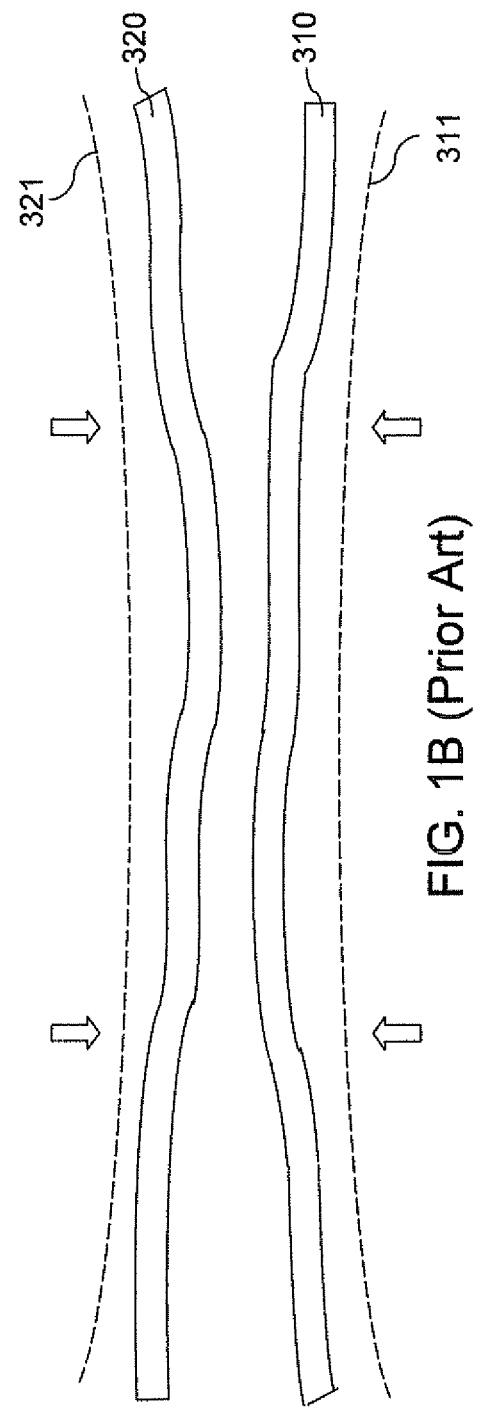
FIG. 1A (Prior Art)
FIG. 1B (Prior Art)

ADAPTIVE CHUCK FOR PLANAR BONDING BETWEEN SUBSTRATES

BACKGROUND

This invention relates to apparatuses for reducing bowing and warping in substrates during substrate bonding and methods of employing the same.

Bonding of multiple substrates is required to enable three-dimensional integration of semiconductor chips. Through-substrate-via (TSV) structures, formed after multiple substrates are bonded and optionally thinned, provide electrical connection across the multiple substrates in a bonded structure including at least two semiconductor substrates. The bonded structure can be subsequently diced to provide stacked chips. Each stacked chip includes a plurality of semiconductor chips stacked in the vertical direction with electrical connection therebetween.

Substrates are subject to local warping and bending due to internal stress. In the case of semiconductor substrates including many semiconductor devices composed of different semiconductor materials, insulator materials, and/or conductor materials and subjected to elevated temperatures during processing, the local warping and/or global bowing of the semiconductor substrates can be substantial. For example, for a semiconductor substrate with a 300 mm diameter and a thickness of about 800 microns, the radius of curvature of global bowing can be less than 100 m, which can generate a deviation of a surface of the semiconductor substrate from a nominally planar surface by a distance on the order of tens of microns.

The difficulty of bonding two semiconductor substrates having a local warping and/or a global bowing is illustrated in FIG. 1A. In FIG. 1A, a first semiconductor substrate 310 and a second semiconductor substrate 320 are brought into contact for bonding. Each of the first and second semiconductor substrates (310, 320) has a built-in global bowing. Unless the two semiconductor substrates have the same amount of global bowing in the same direction, some portions of the resulting bonded structure includes a gap between the two semiconductor substrates.

Further, semiconductor substrates to be bonded also have local warping as illustrated in FIG. 1B. The local warping of the semiconductor substrates is superposed to the global bowing of the semiconductor substrates. For example, the first semiconductor substrate 310 may have a first global bowing built in as schematically illustrated by a first global bowing curve 311, and the second semiconductor substrate 320 may have a second global bowing built in as schematically illustrated by a second global bowing curve 321. The variation superposed to the global bowing is the local warping of each semiconductor substrate (310, 320). In general, the combination of global bowing and local warping in each semiconductor substrate generates gaps in bonded structures employed to form stacked chips.

Presence of such a gap in a bonded structure of two or more semiconductor substrates presents difficulties in subsequent processing by preventing formation of continuous through substrate vias or by allowing unintentional ingress of materials during planarization or wet processing steps.

BRIEF SUMMARY

In one embodiment of the present invention, an electrostatic chuck including an array of independently biased conductive chuck elements is employed to flatten a substrate for bonding with another substrate. The electrostatic chuck can optionally include a set of commonly biased conductive chuck elements. The independently biased conductive chuck elements are electrically biased to compensate for bowing or warping of the substrate thereupon.

In another embodiment of the present invention, an electrostatic chuck includes an array of sensor-conductor assemblies. Each sensor-conductor assembly includes a conductive chuck element, a sensor configured to detect a substrate upon contact, and a motor that moves the sensor and the conductive chuck element vertically. The sensor detects the degree of deviation of the non-planar surface of a substrate from a planar surface. The conductive chuck element attached to each sensor-motor assembly is electrically biased by an electrostatic potential that is determined based on the detected deviation of the non-planar surface of the substrate from the planar surface at each sensor-motor assembly. The electrostatic bias voltage to the conductive chuck elements reduces the bowing and warping of the substrate for bonding. Alternately, a combination of an array of sensor-conductor assemblies and at least one motorized conductive chuck element can be employed to reduce the bowing and warping of a substrate for bonding.

According to an aspect of the present invention, an apparatus for flattening at least one substrate is provided. The apparatus includes an electrostatic chuck and a plurality of electrical lead wires. The electrostatic chuck includes an insulating chuck body having a planar surface; and an array of conductive chuck elements embedded in the insulating chuck body and electrically insulated from one another, wherein exposed surfaces of the conductive chuck elements are coplanar with the planar surface of the insulating chuck body. The plurality of electrical lead wires are electrically isolated from one another and configured to provide independent electrostatic bias to each of the conductive chuck elements.

According to another aspect of the present invention, another apparatus for flattening at least one surface is provided. The apparatus including an electrostatic chuck and a plurality of electrical lead wires. The electrostatic chuck includes an insulating chuck body having a planar surface; and an array of sensor-conductor assemblies embedded in the insulating chuck body and electrically insulated from one another, wherein each of the sensor-conductor assemblies includes a conductive chuck element, a sensor configured to detect a substrate upon contact, and a motor that moves the sensor vertically.

According to yet another aspect of the present invention, a method of processing at least one substrate is provided. The method includes mapping vertical deviations of a surface of a substrate from a flat plane; placing the substrate on an electrostatic chuck including an insulating chuck body and an array of conductive chuck elements embedded in the insulating chuck body; and providing an electrostatic bias voltage to each of the conductive chuck elements. The surface of the substrate is flattened by variations in electrostatic bias voltages applied to the array of conductive chuck elements.

According to still another aspect of the present invention, another method of processing at least one substrate is provided. The method includes placing a substrate on an electrostatic chuck including an insulating chuck body and an array of sensor-conductor assemblies embedded in the insulating chuck body; mapping vertical deviations of a surface of the substrate from a flat plane; and providing an electrostatic bias voltage to each of the conductive chuck elements. Each of the sensor-conductor assemblies includes a conductive chuck element, a sensor configured to detect a substrate upon contact, and a motor that moves the sensor vertically. The surface of the substrate is flattened by variations in electrostatic bias voltages applied to the array of conductive chuck elements.

BRIEF DESCRIPTION OF THE SEVERAL VIEWS OF THE DRAWINGS

FIG. 1A is a vertical cross-sectional view of a first prior art exemplary structure in which two substrates each having a global bowing in different directions are shown.

FIG. 1B is a vertical cross-sectional view of a second prior art exemplary structure in which two substrates each having a global bowing and local warping are shown.

DETAILED DESCRIPTION

Figure 2:
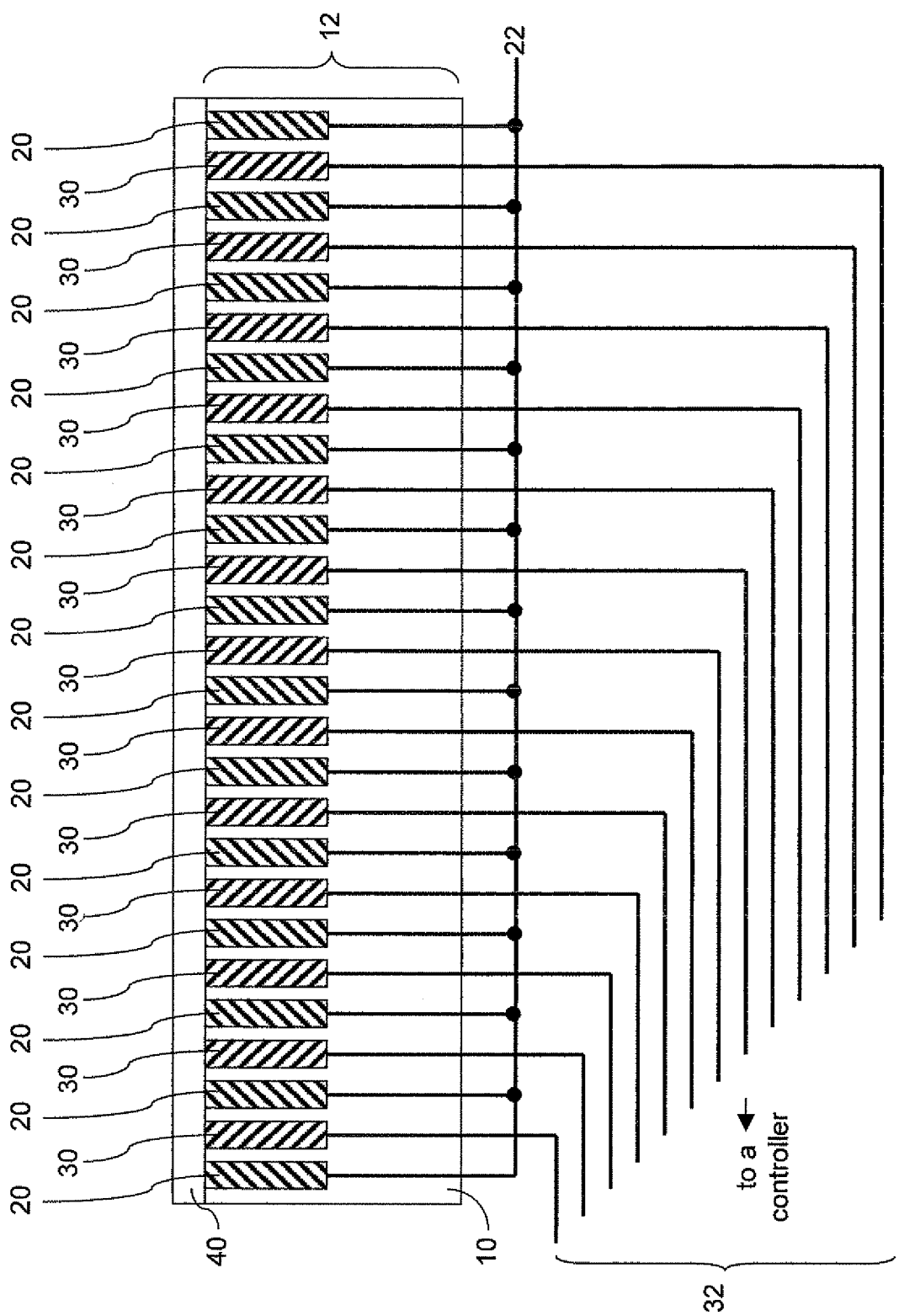
FIG. 2 is a vertical cross-sectional view of a first exemplary apparatus according to a first embodiment of the present invention.

As stated above, the present invention relates to apparatuses for reducing bowing and warping in substrates during substrate bonding and methods of employing the same, which are now described in detail with accompanying figures. Throughout the drawings, the same reference numerals or letters are used to designate like or equivalent elements. The drawings are not necessarily drawn to scale.

As used herein, an "electrostatic chuck" is a structure configured to hold a substrate by electrostatic force.

As used herein, a "flattening" of an element means reducing bowing or warping of said element to make a surface of the element more closely approximate a planar two-dimensional surface.

Figure 3:
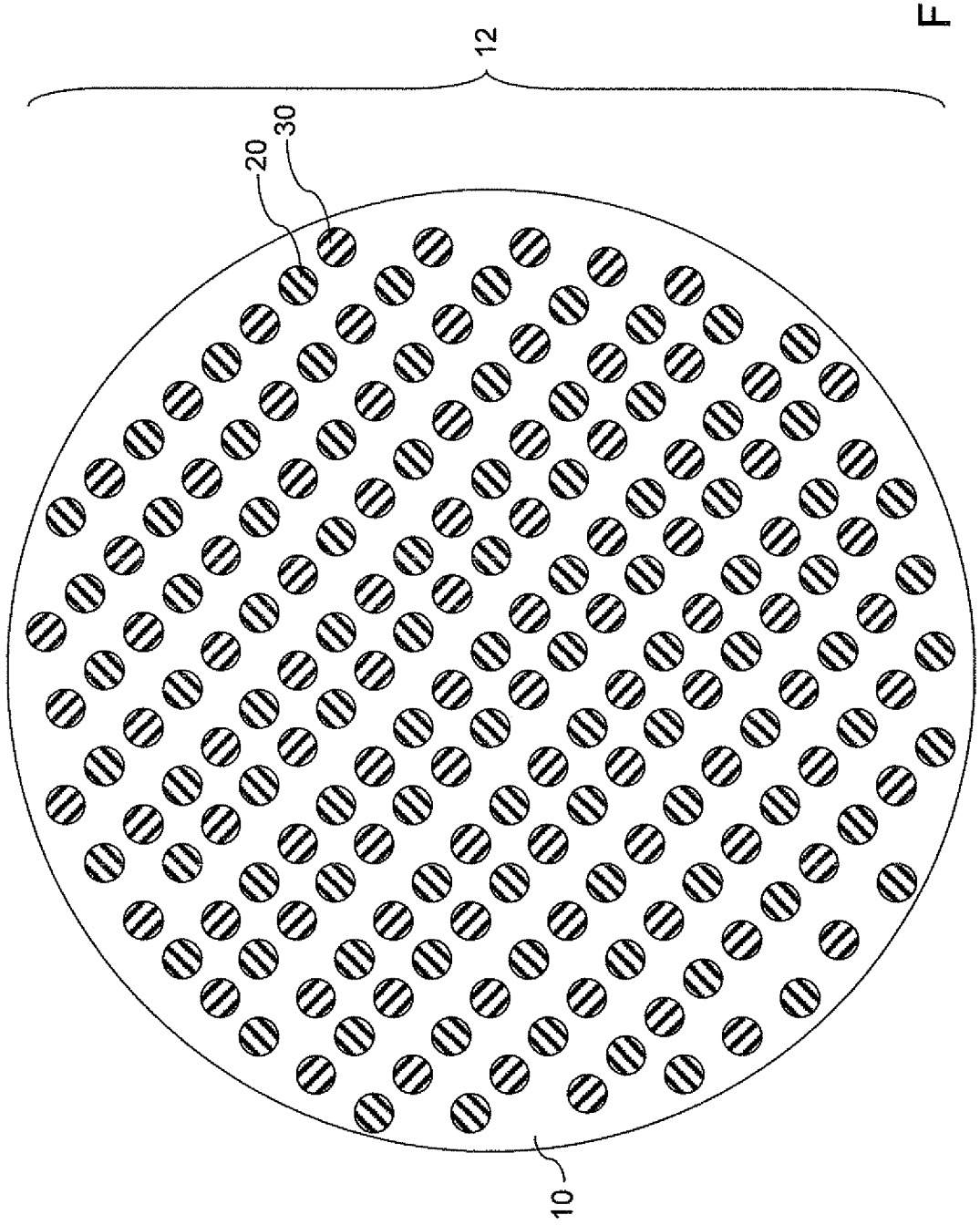
FIG. 3 is a top-down view of the first exemplary apparatus according to the first embodiment of the present invention.

Referring to FIGS. 2 and 3, a first exemplary apparatus according to a first embodiment of the present invention is shown. FIG. 2 is a vertical cross-sectional view of the first exemplary apparatus with a substrate 40 on a top surface thereof. FIG. 3 is a top-down view of the first exemplary apparatus without a substrate thereupon. In FIG. 2, the substrate 40 is shown as flattened, i.e., after bowing and warping of the substrate 40 is reduced to make a bottom surface of the substrate 40 more closely approximate the planar two-dimensional top surface of an insulating chuck body 10 through electrostatic biasing described below.

The first exemplary apparatus includes an electrostatic chuck 12 and a plurality of electrical lead wires 32 that are attached to the electrostatic chuck 12 to generate a locally non-uniform electrostatic potential field. The electrostatic chuck 12 includes the insulating chuck body 10 and an array of independently biased conductive chuck elements 30 embedded in the insulating chuck body 10. The insulating chuck body 10 has a planar top surface on which the substrate 40 can be placed. The independently biased conductive chuck elements 30 in the array are electrically insulated from one another so that each independently biased conductive chuck element 30 can be electrostatically biased independently. A thin layer of insulating coating (not shown) may be provided on the exposed surfaces of the independently biased conductive chuck elements 30 to prevent direct electrical shorts between the independently biased conductive chuck elements 30 and the substrate 40. The exposed surfaces of the independently biased conductive chuck elements 30 are coplanar with the planar top surface of the insulating chuck body 10.

The plurality of electrical lead wires 32 are electrically isolated from one another. The plurality of electrical lead wires 32 are configured to provide independent electrostatic bias to each of the independently biased conductive chuck elements 30. The plurality of electrical lead wires 32 can be connected to a controller (not shown), which generates electrostatic bias voltages to be transmitted to each of the independently biased conductive chuck elements 30 through the plurality of electrical lead wires 32. Each of the electrical lead wires 32 can include a portion that is embedded in the insulating chuck body 10.

In one embodiment, the electrostatic chuck 12 can include an array of commonly biased conductive chuck elements 20 that are electrically shorted among one another. A common electrostatic bias voltage can be applied to the array of commonly biased conductive chuck elements 20 through interconnected common electrical lead wires 22, portions of which are embedded in the insulating chuck body 10 and electrically connect respective conductive chuck elements 20. In one embodiment, the array of the independently biased conductive chuck elements 30 can be interlaced with the array of commonly biased conductive chuck elements 20.

The insulating chuck body 10 can be composed of an insulating material such as glass, quartz, sapphire, silicon carbide. Alternately, the insulating chuck body can have any of a conductive material, a semiconductor material, an insulator material, or a combination thereof, provided that an insulating coating layer (not shown) is formed on all surfaces that contact conductive elements such as the independently biased conductive chuck elements 30, the commonly biased conductive chuck elements 20, the plurality of electrical lead wires 32, and the interconnected common electrical lead wires 22 that are connected to a single voltage source (not shown). Preferably, each of the independently biased conductive chuck elements 30 and the commonly biased conductive chuck elements 20 is coated with an insulating material on a surface at which physical contact can be made with the substrate 40 to prevent electrical shorts in case the substrate 40 has a conductive bottom surface.

A substrate contact ring 60 contacts exposed edges of the substrate 40 to electrically bias substrate. The uniform difference between the voltage applied to the substrate 40 and the voltage applied to the commonly biased conductive chuck elements 20 generates a substantially uniform attractive force field between the top surface of the electrostatic chuck 12 and the substrate 40. The locally varying difference between the voltage applied to the substrate 40 and the voltage applied to the independently biased conductive chuck elements 30 generates a locally varying force field between the top surface of the electrostatic chuck 12 and the substrate 40. The locally varying force field can be attractive throughout the top surface of the electrostatic chuck 12, or can be attractive or repulsive depending on the location on the top surface of the electrostatic chuck 12.

Each of the independently biased conductive chuck elements 30 can be a conductive cylinder having dimensions that provide sufficient spatial granularity to compensate for the bowing and/or the warping present in the substrate 40 as provided, which can have bowing or warping as illustrated in FIGS. 1A and 1B for the first and second semiconductor substrates (310, 320). For example, if the electrostatic chuck 12 is employed to hold a semiconductor substrate, the diameter of the electrostatic chuck 12 can be from 100 mm to 300 mm. Each of the conductive chuck elements can be a conductive cylinder having a diameter from 5 microns to 10 cm, and preferably from 20 microns to 2 cm, although lesser and greater diameters can also be employed.

Information required to determine the electrostatic voltage to be applied to each of the independently biased conductive chuck elements 30 can be generated by measuring the bowing and the warping of the substrate 40 prior to loading the substrate 40 onto the top surface of the electrostatic chuck 12. Specifically, vertical deviations of a surface of the substrate 40 from a horizontal two-dimensional surface are measured at a predetermined azimuthal angle. For example, the substrate 40 can be loaded in a stress measurement tool employing a laser beam, which detects the deviation of the surface orientation of the substrate 40 from a horizontal two-dimensional surface. A map of the vertical deviations of the top surface of the substrate 40 or the bottom surface of the substrate 40 can be generated from such laser beam scans.

After the mapping of the vertical deviations of a surface of the substrate 40 from a flat plane is completed, the substrate 40 is placed on the top surface of the electrostatic chuck 12. An electrostatic bias voltage is applied to each of the independently biased conductive chuck elements 30. The data in the map of the vertical deviations of the top surface of the substrate 40 can be supplied to a controller (not shown) attached to the plurality of electrical lead wires 32. The electrostatic bias voltage to each of the independently biased conductive chuck elements 30 can be determined based on the vertical deviation of a surface of the substrate 40 above the independently biased conductive chuck element 30. A map of the vertical deviation of the surface of the substrate 40 can be generated, for example, by an independent measurement method that determines the contour of the surface of the substrate 40. If the deviation of the surface of the substrate 40 above an independently biased conductive chuck element 30 is greater than the corresponding deviation around the independently biased conductive chuck element 30, the electrostatic bias voltage applied to the independently biased conductive chuck element 30 is increased from an average electrostatic bias voltage. If the deviation of the surface of the substrate 40 above the independently biased conductive chuck elements 30 is less than the corresponding deviation around the independently biased conductive chuck element 30, the electrostatic bias voltage applied to the independently biased conductive chuck element 30 is reduced from the average electrostatic bias voltage. The bottom surface and the top surface of the substrate 40 are flattened by variations in the electrostatic bias voltages applied to the array of independently biased conductive chuck elements 30. The electrostatic bias voltages vary according to the measured vertical deviations of a surface of the substrate 40 from a flat plane prior to loading onto the electrostatic chuck 12.

Figure 4:
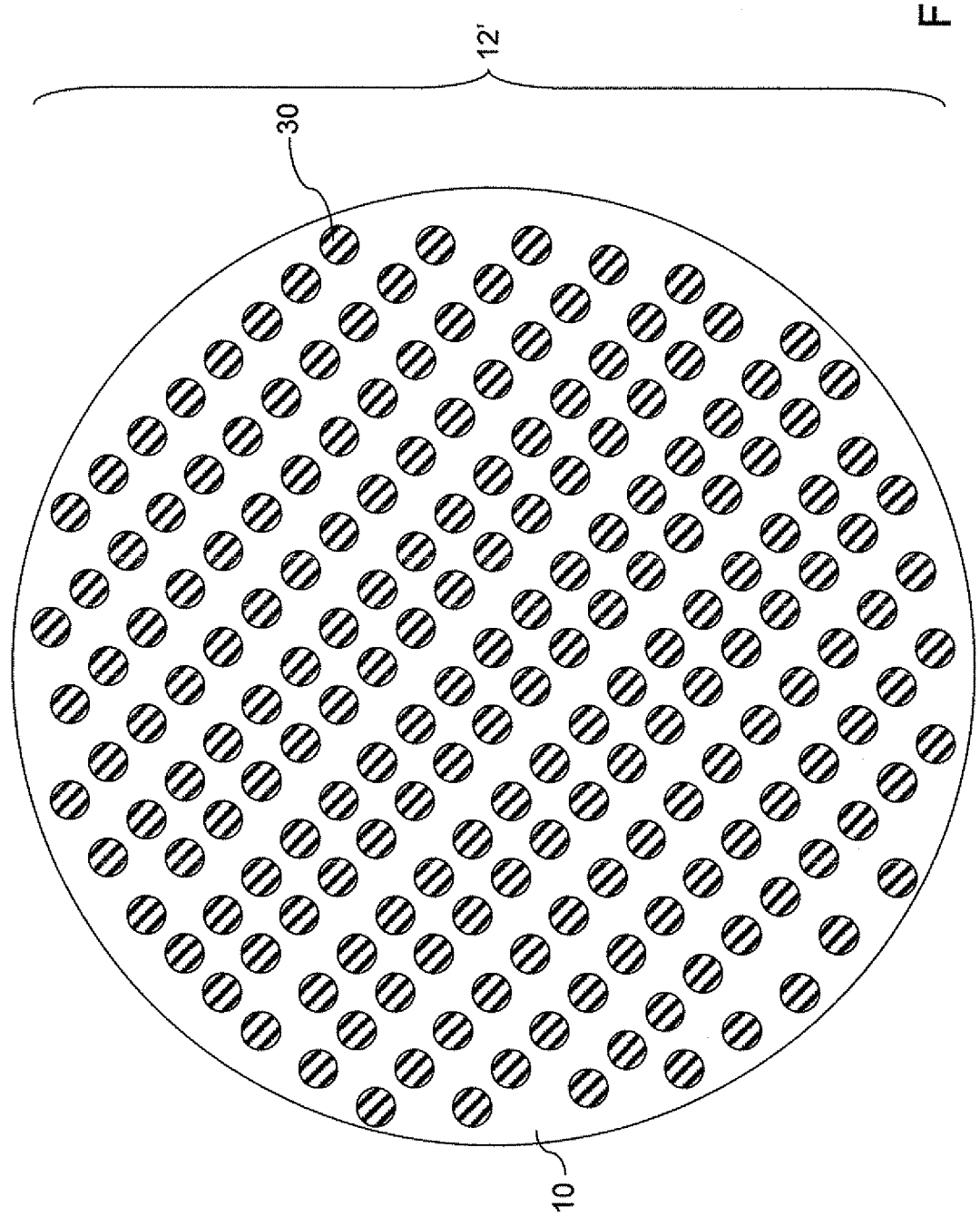
FIG. 4 is a top-down view of a variation of the first exemplary apparatus according to the first embodiment of the present invention.

Referring to FIG. 4, a variation of the first exemplary apparatus according to the first embodiment of the present invention includes an electrostatic chuck 12' embedding an array of independently biased conductive chuck elements 30 but not including an array of commonly biased conductive chuck elements 20. Each of the independently biased conductive chuck elements 30 can be biased in the same manner as in the first exemplary apparatus of FIGS. 2 and 3 to flatten surfaces of a substrate loaded thereupon.

Figure 5:
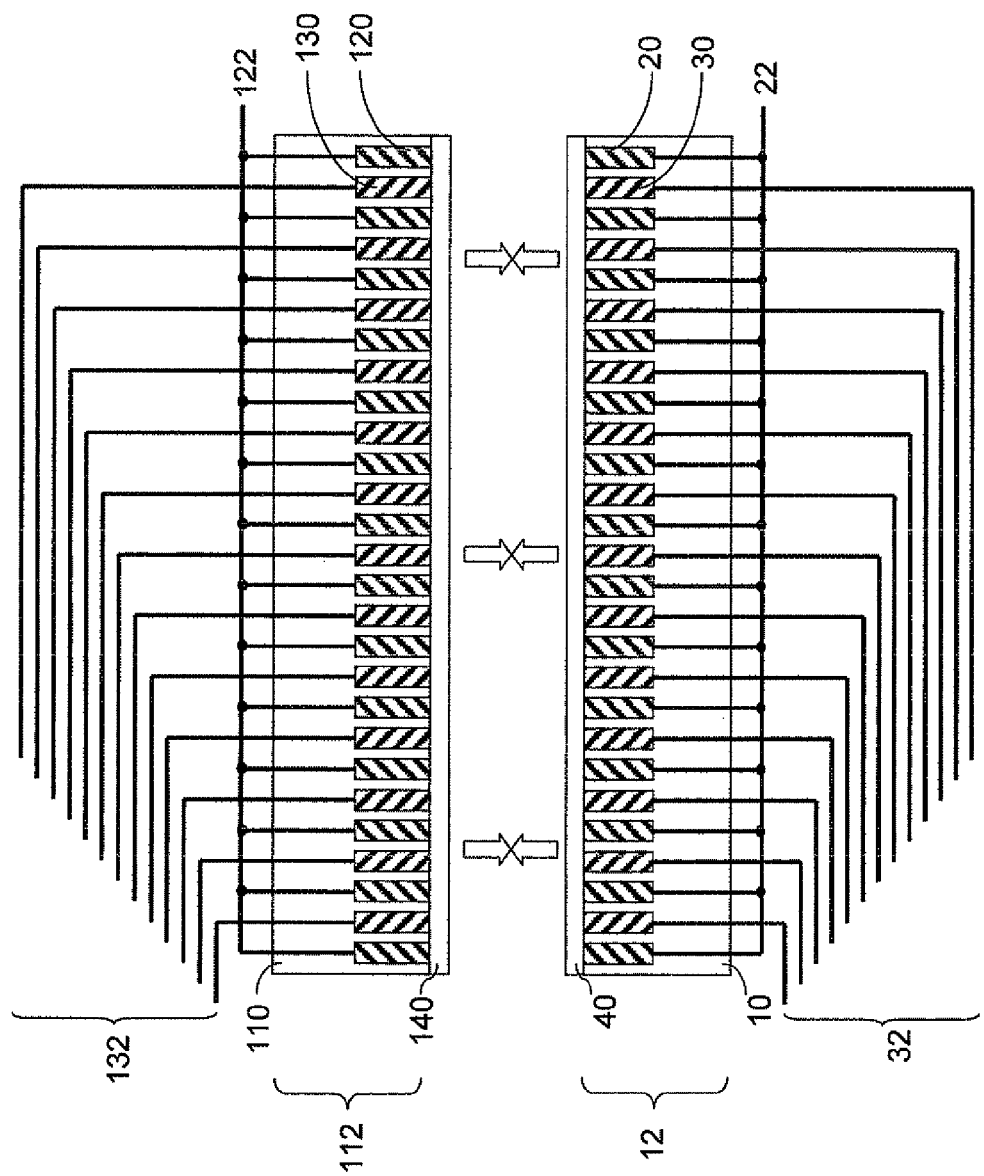
FIG. 5 is a vertical cross-sectional view of a second exemplary structure according to the first embodiment of the present invention.

Referring to FIG. 5, a second exemplary structure according to the first embodiment of the present invention includes a substrate 40, which is held by electrostatic force between the substrate 40 and an electrostatic chuck 12, and a second substrate 140, which is held by electrostatic force between the second substrate 140 and a second electrostatic chuck 112. The substrate contact ring 60 applies an electrostatic potential to the substrate 40, and a second substrate contact ring 160 applies an electrostatic potential to the second substrate 140. The second electrostatic chuck 112 and the second substrate 140 can be spaced from the electrostatic chuck 12 and the substrate 40. The second substrate 140 and the second electrostatic chuck 112 may overlie the first substrate 40 and the electrostatic chuck 12. Alternately, the substrate 40 may contact the electrostatic chuck 12 on a first vertical plane and the second substrate 140 may contact the second electrostatic chuck 112 on second vertical plane that is parallel to the first vertical plane. Additional clamping devices (not shown) can be employed to ensure that the substrate 40 and/or the second substrate 140 do not slide or fall due to gravitational forces. The second electrostatic chuck 112 is configured to bring the second substrate 140 into physical contact with the substrate 40 on the electrostatic chuck 12.

The assembly of the electrostatic chuck 12 and the plurality of the electrical lead wires 32 can be physically and/or functionally the same as the first exemplary assembly shown in FIGS. 2 and 3 or the variation of the first exemplary assembly shown in FIG. 4. Likewise, the assembly of the second electrostatic chuck 112 and a plurality of second electrical lead wires 132 can be physically and/or functionally the same as the first exemplary assembly shown in FIGS. 2 and 3 or the variation of the first exemplary assembly shown in FIG. 4.

Specifically, the second electrostatic chuck 112 includes a second insulating chuck body 110 and a second array of second independently biased conductive chuck elements 130 embedded in the second insulating chuck body 110. The second array of the second independently biased conductive chuck elements 130 is embedded in the second insulating chuck body 110. The second independently biased conductive chuck elements 130 are electrically insulated from one another. The second independently biased conductive chuck elements 130 can be coated with an insulating layer to prevent electrical shorts with the second substrate 140. The second substrate 140 contacts the second insulating chuck body 110 at a second planar surface. Exposed surfaces, i.e., the surfaces that contact the second substrate 140, of the second independently biased conductive chuck elements 130 are coplanar with the second planar surface of the second insulating chuck body 110.

An electrostatic bias voltage can be applied to each of the second independently biased conductive chuck elements 130 according to measured vertical deviations of a surface of the second substrate 140 from a flat plane prior to loading onto the second electrostatic chuck 112. This can be done in the same manner as an electrostatic bias voltage is applied to each of the independently biased conductive chuck elements 30. The top surface and the bottom surface of the second substrate 140 are flattened by variations in the electrostatic bias voltages applied to the second array of second independently biased conductive chuck elements 130. In general, the greater the vertical deviation of point on the bottom surface of the substrate 40 from the top surface of the electrical chuck 12 prior to application of the electrical bias to the independently biased conductive chuck elements 30, the greater the differential between the voltage applied to the substrate 40 and the voltage applied to the independently biased independently biased conductive chuck element 30 located at that point once the independently biased conductive chuck elements 30 are electrically biased. Likewise, the greater the vertical deviation of point on the bottom surface of the substrate 40 (which is a bottom surface of the substrate when viewed upside down as in FIG. 5) from the top surface of the electrical chuck 12 (which is a bottom surface of the electrical chuck 12 when viewed upside down as in FIG. 5) prior to application of the electrical bias to the second independently biased conductive chuck elements 130, the greater the differential between the voltage applied to the substrate 40 and the voltage applied to the second independently biased independently biased conductive chuck element 130 located at that point once the second independently biased conductive chuck elements 130 are electrically biased.

Optionally, an array of second commonly biased conductive chuck elements 120 can be embedded in the second insulating chuck body 110. A common electrostatic bias voltage can be applied to the array of the second commonly biased second conductive chuck elements 120 through second interconnected common electrical lead wires 122 connected to a single voltage source (not shown).

While the substrate 40 remains flattened by electrostatic bias voltages applied to the independently biased conductive chuck elements 30 and the second substrate 140 remains flattened by electrostatic bias voltages applied to the second independently biased conductive chuck elements 130, the second substrate 140 is brought into physical contact with the substrate 40 so that the second substrate 140 is bonded with the substrate 40. A bonded structure having a planar interface between the substrate 40 and the second substrate 140 is formed. The bowing and warping of the substrate 40 and the second substrate 140 are compensated for to flatten surfaces of the substrate 40 and the second substrate 140 by the variations in the electrostatic bias voltages applied to the array of independently biased conductive chuck element 30 and the second array of second independently biased conductive chuck elements 130. The variations in the applied electrostatic bias voltages are based on measured vertical deviations of the surfaces of the substrate 40 and the second substrate 140. Therefore, the planar interface between the substrate 40 and the second substrate 140 approximates a two-dimensional flat surface more closely than interfaces obtainable in conventionally bonded structures.

Figure 6:
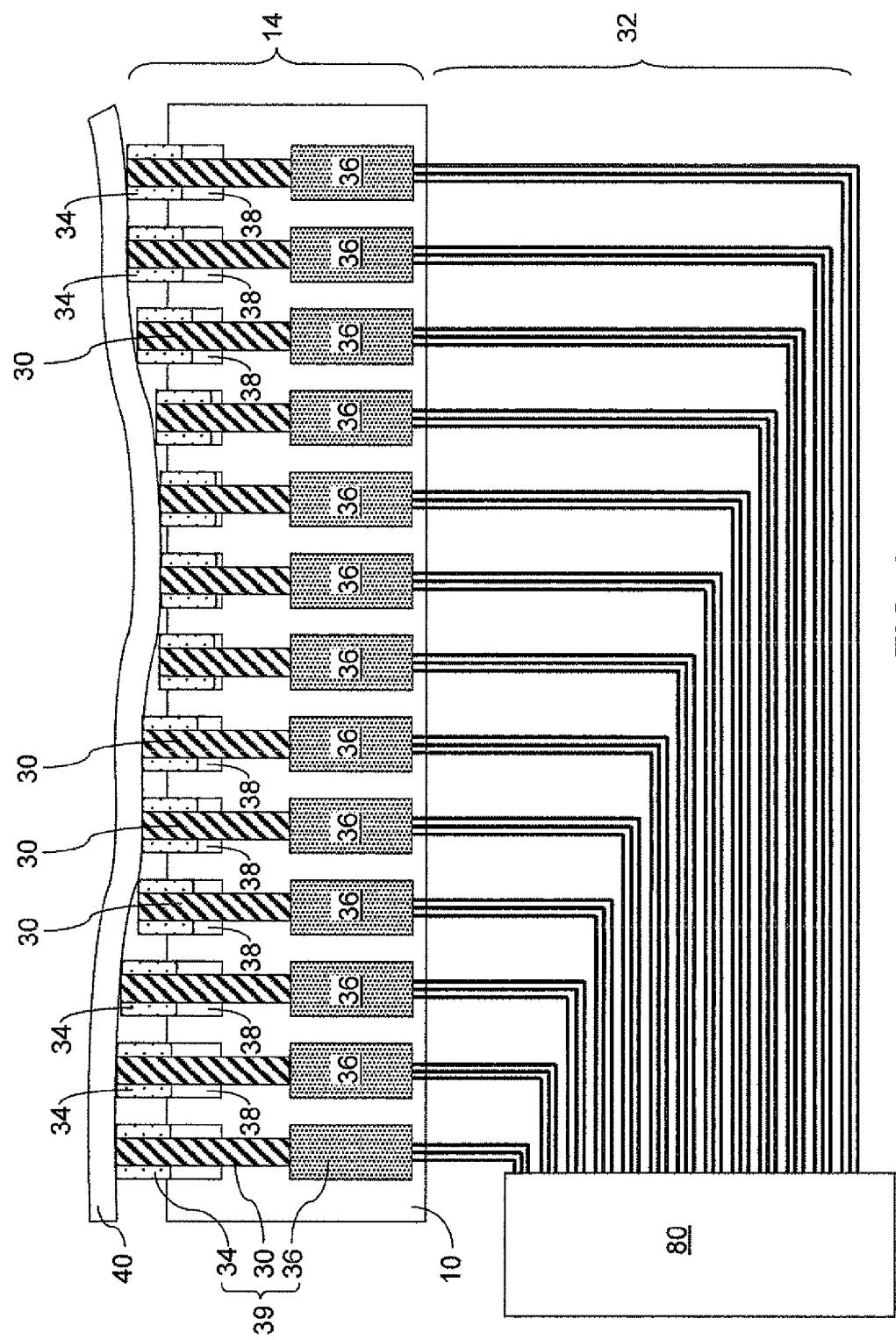
FIG. 6 is a vertical cross-sectional view of a third exemplary structure during sensing of a substrate according to a second embodiment of the present invention.

Referring to FIG. 6, a third exemplary structure according to a second embodiment of the present invention includes an electrostatic chuck 14 and a plurality of electrical lead wires 32 that are attached to the electrostatic chuck 14 to generate a locally non-uniform electrostatic potential field. The electrostatic chuck 14 includes the insulating chuck body 10 and an array of sensor-conductor assemblies 39 embedded in the insulating chuck body 10. The insulating chuck body 10 has a planar top surface on which a substrate 40 can be placed. The substrate 40 is shown as provided, i.e., has the features of bending and warping inherently present in the substrate 40. The vertical scale is exaggerated compared with the horizontal scale for the substrate 40.

The sensor-conductor assemblies 39 in the array are electrically insulated from one another. Each of the sensor-conductor assemblies 39 includes an independently biased conductive chuck element 30, a sensor 34 configured to detect the substrate 40 upon contact or by detection in proximity, and a motor 36 that moves the sensor 34 vertically. A thin layer of insulating coating (not shown) may be provided on the exposed surfaces of the independently biased conductive chuck elements 30 to prevent direct electrical shorts between the independently biased conductive chuck elements 30 and the substrate 40. The exposed surfaces of the independently biased conductive chuck elements 30 are coplanar with the planar top surface of the insulating chuck body 10. Each independently biased conductive chuck element 30 is electrically isolated from other independently biased conductive chuck elements 30 to enable independent electrostatic biasing.

Each sensor 34 is located on one of the independently biased conductive chuck elements 30 so that the sensor 34 moves with an independently biased conductive chuck element 30 attached thereto. The sensor 34 can be attached to sidewalls of a top portion of the independently biased conductive chuck element 30. A motor 36 is attached to each independently biased conductive chuck element 30. Each motor 36 causes vertical movement of the independently biased conductive chuck element 30 and the sensor 34 attached thereto to enable in-situ detection of the contour of the bottom surface of the substrate 40. When a sensor 34 in a sensor-conductor assembly 39 moves up from its lowest position, a cavity 38 can be formed in the insulating chuck body 10. Each motor 36 can be configured to provide a constant speed of movement for the independently biased conductive chuck element 30 and the sensor 34 attached thereto 12. The sensors 34 can be configured to move upward at a constant speed until the substrate 40 is detected upon a command from a controller 80.

If all the motors 36 are configured to provide the same speed of movement for the sensors 34, the time period between the beginning of the movement of a sensor 34 and ending of the movement of the sensor 34 upon detection of the substrate 40 is a measure of the distance between the top surface of the insulating chuck body 10 and the bottom surface of the substrate 40 at the location of the sensor 34. The controller 80 can be configured to adjust the electrostatic bias voltage applied to an independently biased conductive chuck element 30 linearly with the time period measured by the sensor 34 attached to the independently biased conductive chuck element 30 between the beginning and the end of the movement of the sensor 34.

The plurality of electrical lead wires 32 are electrically isolated from one another. Each of the plurality of electrical lead wires 32 can include a portion that is embedded in the insulating chuck body 10. Some of the plurality of electrical lead wires 32 are configured to provide independent electrostatic bias to each of the independently biased conductive chuck elements 30. These electrical lead wires 32 can be connected to the controller 80, which generates electrostatic bias voltages to be transmitted to each of the independently biased conductive chuck elements 30 through these electrical lead wires 32.

Some others of the plurality of electrical lead wires 32 can be configured to transmit a detection signal to the controller 80 when a sensor 34 in a sensor-conductor assembly 39 detects the substrate 40 by proximity sensing or by contact.

Optionally, the electrostatic chuck 14 can include an array of commonly biased conductive chuck elements (not shown) that are electrically shorted among one another. A common electrostatic bias voltage can be applied to the array of commonly biased conductive chuck elements, if present, through interconnected common electrical lead wires (not shown).

The array of the sensor-conductor assemblies 39 can be interlaced with the array of commonly biased conductive chuck elements.

The insulating chuck body 10 can have an insulating material and/or an insulating coating layer as in the first embodiment. Preferably, each of the independently biased conductive chuck elements 30 is coated with an insulating material on a surface at which physical contact can be made with the substrate 40 to prevent electrical shorts in case the substrate 40 has a conductive bottom surface. As in the first embodiment, each of the independently biased conductive chuck elements 30 can be a conductive cylinder having dimensions that provide sufficient spatial granularity to compensate for the bowing and/or the warping present in the substrate 40 as provided.

Information required to determine the electrostatic voltage to be applied to each of the independently biased conductive chuck elements 30 can be generated by measuring the bowing and the warping of the substrate 40 after loading the substrate 40 onto the top surface of the electrostatic chuck 14. The top surface of the insulating chuck body 10 is a horizontal two-dimensional flat surface. Vertical deviations of a surface of the substrate 40 from the top surface of the insulating chuck body 10 are measured employing the sensors 34 in the array of sensor-conductor assemblies 39. A map of the vertical deviations of the top surface or the bottom surface of the substrate 40 can be generated by measuring the time periods between the beginning and the end of the movement of sensors 34 as described above.

The controller 80 can be configured to transmit to each independently biased conductive chuck element 30 an electrostatic bias voltage that depends on the time period between a beginning of movement and an end of movement of the sensor 34 within a same sensor-conductor assembly 39 as the independently biased conductive chuck element 30. The controller 80 can be configured to adjust the electrostatic bias voltage applied to each of the independently biased independently biased conductive chuck element 30 linearly or non-linearly with the measured time period for each sensor-conductor assembly 39. Before application of the electrical bias to the independently biased independently biased conductive chuck element 30, the independently biased conductive chuck element 30 and the sensors 34 attached thereto are retracted to the bottom most position to provide a flat surface at the top of the electrostatic chuck 14.

The optimal electrostatic bias voltage to each of the independently biased conductive chuck elements 30 can be determined based on the vertical deviation of a surface of the substrate 40 above the independently biased conductive chuck element 30. For example, if the deviation at a point on a surface of the substrate 40 above an independently biased conductive chuck element 30 is greater than corresponding deviations at surrounding points on the surface of the independently biased conductive chuck element 30 that are laterally spaced by a pitch of the array of the independently biased conductive chuck elements 30, the electrostatic bias voltage applied to the independently biased conductive chuck element 30 is increased from an average electrostatic bias voltage. If the deviation at a point on a surface of the substrate 40 above an independently biased conductive chuck element 30 is less than corresponding deviations at surrounding points on the surface of the independently biased conductive chuck element 30 that are laterally spaced by a pitch of the array of the independently biased conductive chuck elements 30, the electrostatic bias voltage applied to the independently biased conductive chuck element 30 is decreased from an average electrostatic bias voltage.

Figure 7:
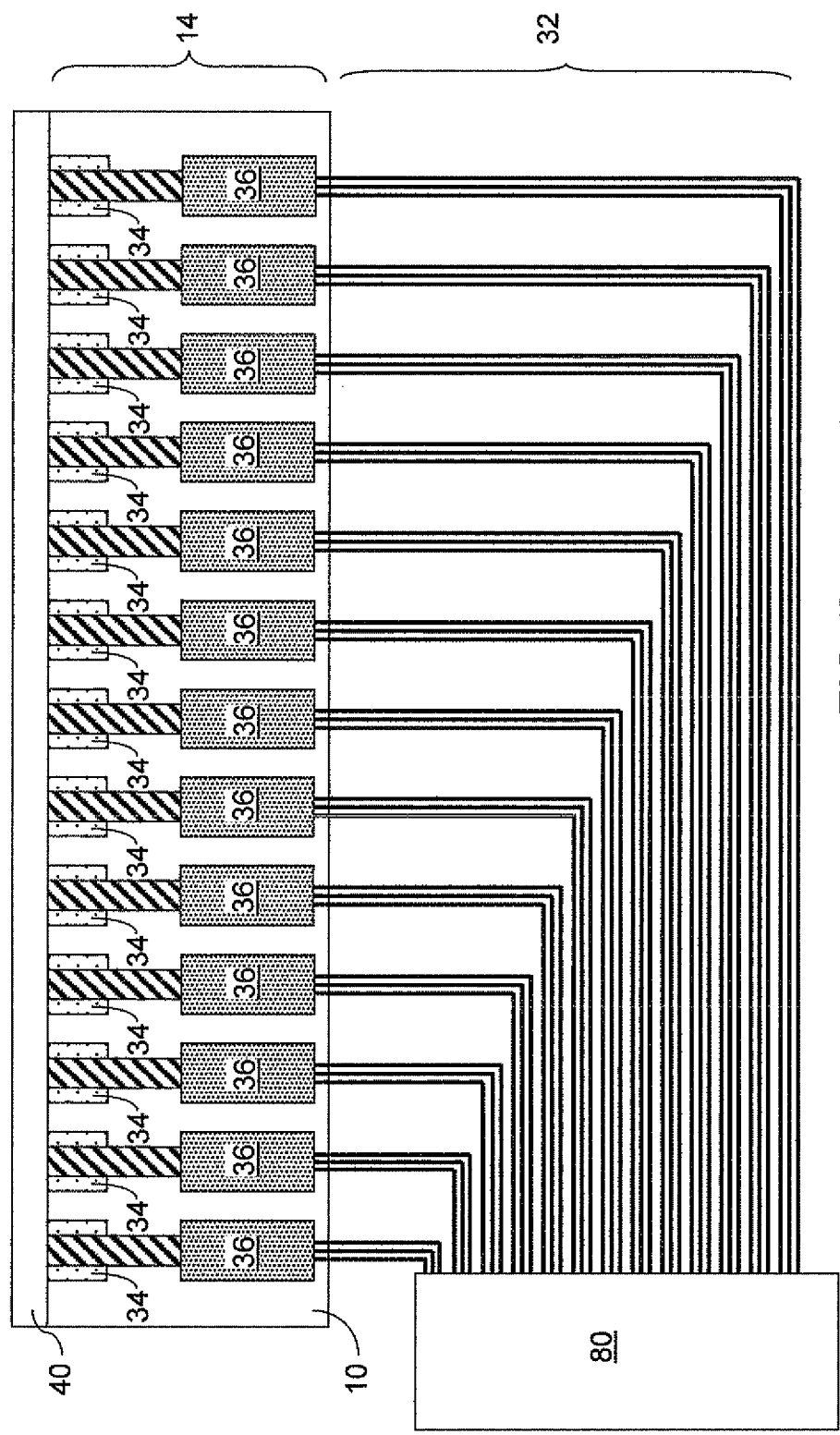
FIG. 7 is a vertical cross-sectional view of the third exemplary structure after the substrate is flattened by electrostatic biases according to the second embodiment of the present invention.

Referring to FIG. 7, once the controller 80 determines optimal electrostatic biasing voltages for each independently biased conductive chuck element 30, the controller 80 applies an electrostatic bias voltage to each of the independently biased conductive chuck elements 30 according to the determined optimal electrostatic biasing voltages. The bottom surface and the top surface of the substrate 40 are flattened by variations in the electrostatic bias voltages applied to the independently biased conductive chuck elements 30. The electrostatic bias voltages vary according to the vertical deviations of the bottom surface of the substrate 40 from the top surface of the insulating chuck body 10 as measured by the array of the sensor-conductor assemblies 39.

Figure 8:
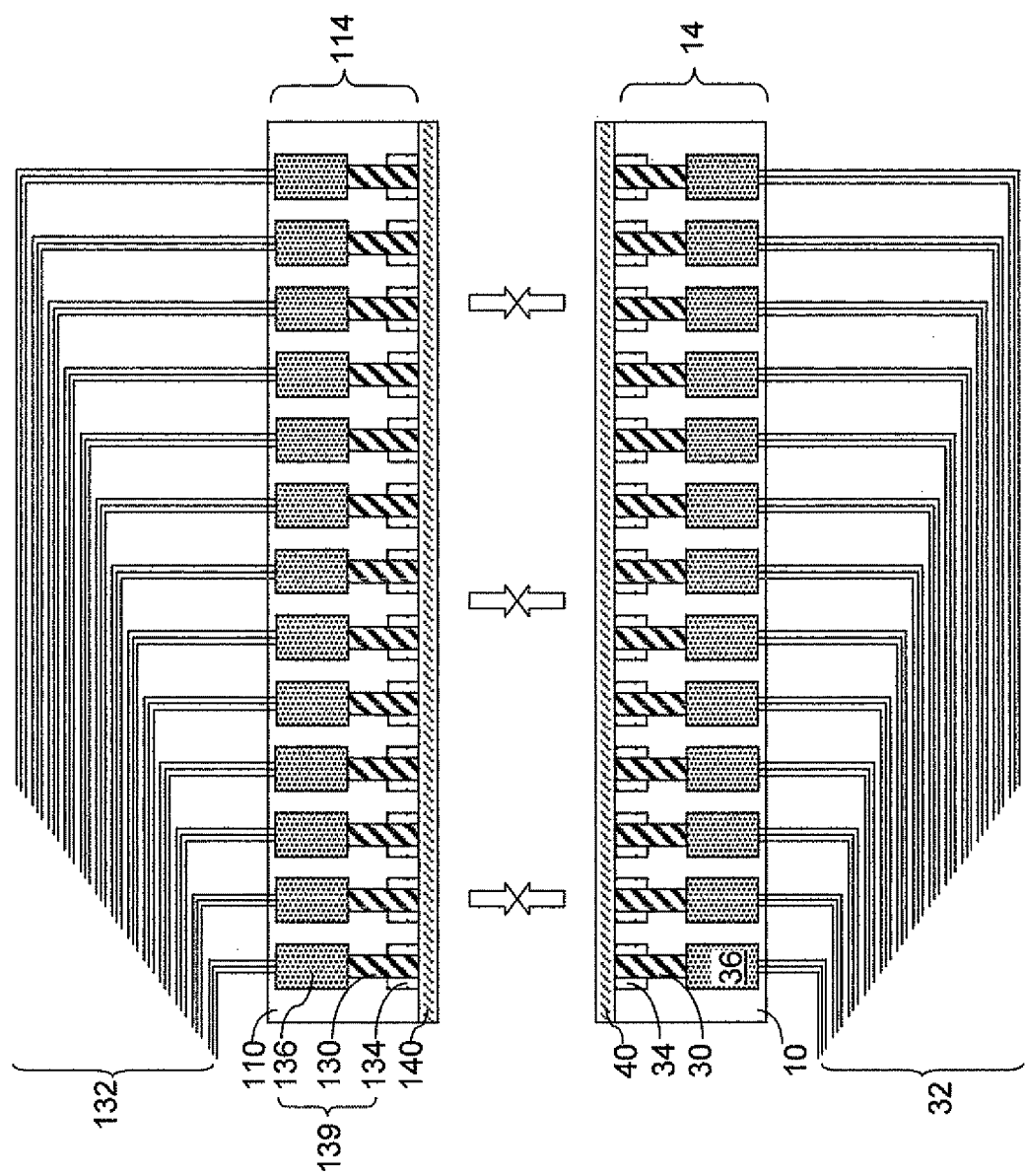
FIG. 8 is a vertical cross-sectional view of a fourth exemplary structure according to the second embodiment of the present invention.

Referring to FIG. 8, a fourth exemplary structure according to the second embodiment of the present invention includes a substrate 40 held by an electrostatic chuck 14 and a second substrate 140 held by a second electrostatic chuck 114. The second electrostatic chuck 114 and the second substrate 140 can be spaced from the electrostatic chuck 14 and the substrate 40. The second substrate 140 and the second electrostatic chuck 114 may directly overlie the first substrate 40 and the electrostatic chuck 14. Alternately, the substrate 40 may contact the electrostatic chuck 14 on a first vertical plane and the second substrate 140 may contact the second electrostatic chuck 114 on second vertical plane that is parallel to the first vertical plane. Additional clamping devices (not shown) can be employed to ensure that the substrate 40 and/or the second substrate 140 do not slide or fall due to gravitational forces. The second electrostatic chuck 114 is configured to bring the second substrate 140 into physical contact with the substrate 40 on the electrostatic chuck 14.

The assembly of the electrostatic chuck 14 and the plurality of the electrical lead wires 32 can be physically and/or functionally the same as the third exemplary assembly shown in FIGS. 6 and 7. Likewise, the assembly of the second electrostatic chuck 114 and a plurality of second electrical lead wires 132 can be physically and/or functionally the same as the third exemplary assembly shown in FIGS. 6 and 7.

Specifically, the second electrostatic chuck 114 includes a second insulating chuck body 110 and a second array of second sensor-conductor assemblies 139 embedded in the second insulating chuck body 110. The second array of the second sensor-conductor assemblies 139 is embedded in the second insulating chuck body 110. The second sensor-conductor assemblies 139 are electrically insulated from one another. Each of the second sensor-conductor assemblies 139 includes a second independently biased conductive chuck element 130, a second sensor 134 configured to detect the second substrate 140 upon contact or by proximity, and a second motor 136 that moves the second sensor 134 vertically. The second independently biased conductive chuck elements 130 can be coated with an insulating layer to prevent electrical shorts with the second substrate 140. The second substrate 140 contacts the second insulating chuck body 110 at a second planar surface. Exposed surfaces, i.e., the surfaces that contact the second substrate 140, of the second independently biased conductive chuck elements 130 are coplanar with the second planar surface of the second insulating chuck body 110.

An electrostatic bias voltage can be applied to each of the second independently biased conductive chuck elements 130 according to measured vertical deviations of a surface of the second substrate 140 from the surface of the second insulating chuck body 110. This can be done in the same manner as an electrostatic bias voltage is applied to each of the independently biased conductive chuck elements 30 in the third exemplary structure. The top surface and the bottom surface of the second substrate 140 are flattened by variations in the electrostatic bias voltages applied to the second array of second independently biased conductive chuck elements 130.

Optionally, an array of second commonly biased conductive chuck elements (not shown) can be embedded in the second insulating chuck body 110. A common electrostatic bias voltage can be applied to the array of the second commonly biased second independently biased conductive chuck elements 130 through second interconnected common electrical lead wires (not shown).

While the substrate 40 remains flattened by electrostatic bias voltages applied to the independently biased conductive chuck elements 30 and the second substrate 140 remains flattened by electrostatic bias voltages applied to the second independently biased conductive chuck elements 130, the second substrate 140 is brought into physical contact with the substrate 40 so that the second substrate 140 is bonded with the substrate 40. A bonded structure having a planar interface between the substrate 40 and the second substrate 140 is formed. As in the first embodiment, the bowing and warping of the substrate 40 and the second substrate 140 are compensated for to flatten surfaces of the substrate 40 and the second substrate 140 by the variations in the electrostatic bias voltages applied to the array of independently biased conductive chuck element 30 and the second array of second independently biased conductive chuck elements 130. The variations in the applied electrostatic bias voltages are based on vertical deviations of the surfaces of the substrate 40 and the second substrate 140 as measured by the array of sensor-conductor assemblies 139 and the array of second sensor-conductor assemblies 139. Therefore, the planar interface between the substrate 40 and the second substrate 140 approximates a two-dimensional flat surface more closely than interfaces obtainable in conventionally bonded structures.

Figure 9:
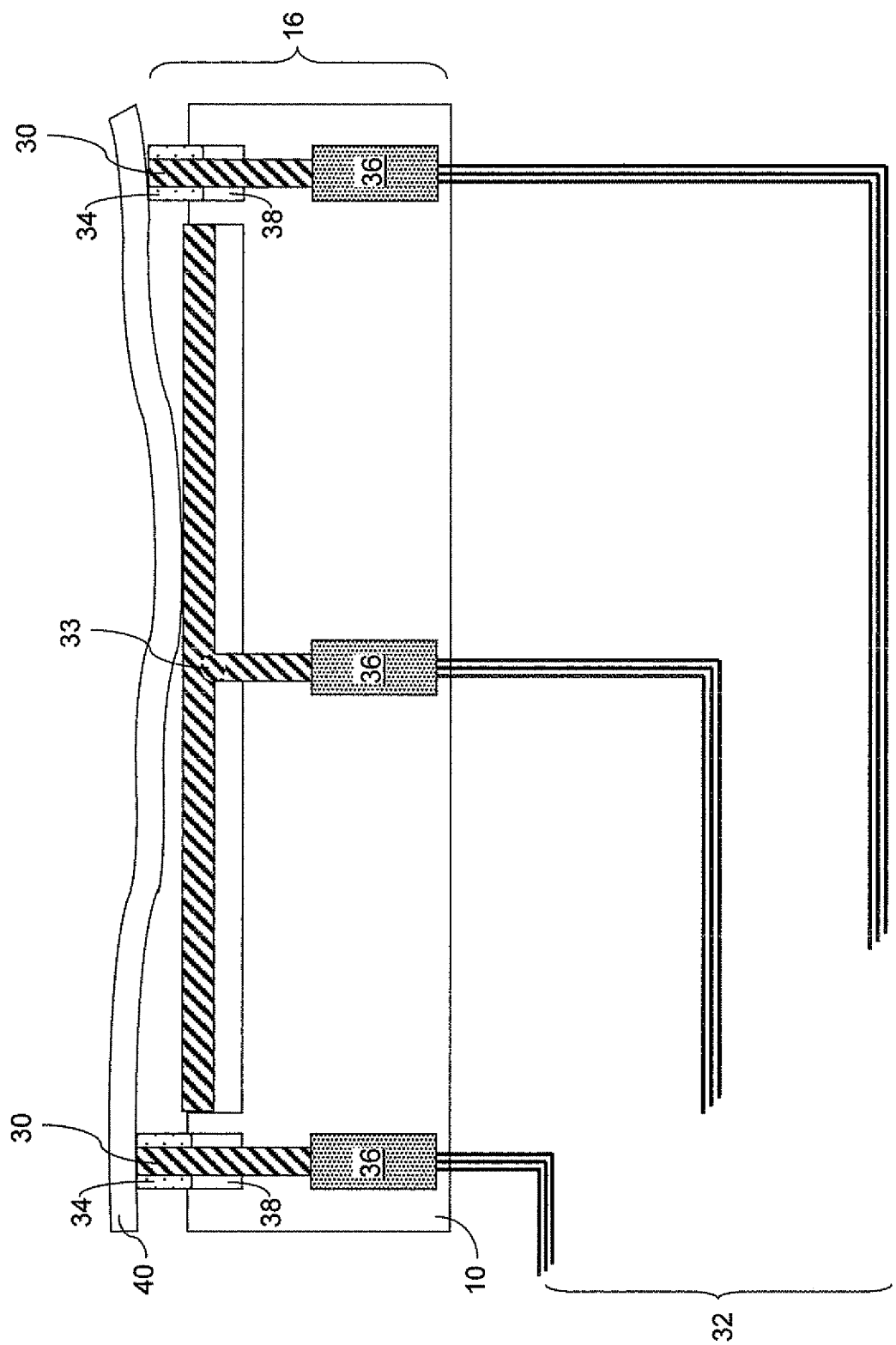
FIG. 9 is a vertical cross-sectional view of a fifth exemplary structure according to the third embodiment of the present invention.

Referring to FIG. 9, a fifth exemplary structure according to the third embodiment of the present invention includes an electrostatic chuck 16 and a plurality of electrical lead wires 32 that are attached to the electrostatic chuck 16 to generate a locally non-uniform electrostatic potential field. The electrostatic chuck 16 includes the insulating chuck body 10 and a plurality of sensor-conductor assemblies 39 embedded in the insulating chuck body 10. The insulating chuck body 10 has a planar top surface on which a substrate 40 can be placed. The substrate 40 is shown as provided, i.e., has the features of bending and warping inherently present in the substrate 40.

The sensor-conductor assemblies 39 have the same physical and functional characteristics as in the third exemplary structure described above. At least one motorized conductive chuck element 33 is embedded in the insulating chuck body 10. Each of the at least one motorized conductive chuck element 33 is configured to vertically move the substrate 40 as needed. The at least one motorized conductive chuck element 33 does not include a sensor for detecting the substrate 40. The fifth exemplary structure can be derived from the third exemplary structure by replacing some of the sensor-conductor assemblies 39 with the at least one motorized conductive chuck element 33. The fifth exemplary structure can be manufactured more cost-effectively than the third exemplary structure because lesser components are required. The fifth exemplary structure can be employed to perform the same functions as the third exemplary structure, i.e., to flatten the substrate 40 by applying electrostatic bias voltages to the independently biased conductive chuck elements 30 and the at least one motorized conductive chuck element 33. Further, two instances of the fifth exemplary structure can be employed to facilitate bonding of two substrates as in the second and fourth exemplary structures so that the interface between two bonded substrate approximates a two-dimensional flat surface more closely than interfaces obtainable in conventionally bonded structures.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. An apparatus for flattening at least one substrate, said apparatus comprising an electrostatic chuck, a plurality of electrical lead wires, and a controller, wherein said electrostatic chuck comprises:

an insulating chuck body having a planar topmost surface and configured to hold a substrate; and an array of sensor-conductor assemblies including independently electrically biased conductive chuck elements, wherein each independently electrically biased conductive chuck element within said array is embedded in said insulating chuck body and is attached to a motor configured to vertically move said independently electrically biased conductive chuck element and is electrically insulated from one another, and wherein said controller is configured to generate a map of a distance between a top surface of said insulting chuck body and a bottom surface of said substrate at a location of each of said array of sensor-conductor assemblies by vertically moving said array of sensor-conductor assemblies until contact with said bottom surface of said substrate, and by determining a time period between initiation of said vertically moving and said contact for each of said array of sensor-conductor assemblies.

2. The apparatus of claim 1, wherein each of said electrical lead wires includes a portion that is embedded in said insulating chuck body.

3. The apparatus of claim 1, wherein said electrostatic chuck further comprises an array of commonly biased conductive chuck elements that are connected to a common voltage source, wherein all of said commonly biased conductive chuck elements receive a common voltage from said common voltage source.

4. The apparatus of claim 3, wherein said array of sensor-conductor assemblies is interlaced with said array of commonly biased conductive chuck elements.

5. The apparatus of claim 1, further comprising a second electrostatic chuck spaced from said electrostatic chuck and said substrate, wherein said second electrostatic chuck is configured to bring a second substrate into physical contact with said substrate on said electrostatic chuck.

6. The apparatus of claim 5, wherein said second electrostatic chuck includes:

a second insulating chuck body having a second planar surface; and a second array of second conductive chuck elements embedded in said second insulating chuck body and electrically insulated from one another, wherein exposed surfaces of said second conductive chuck elements are coplanar with said second planar surface of said second insulating chuck body when retracted toward said second planar surface.

7. An apparatus for flattening at least one substrate, said apparatus comprising an electrostatic chuck, a plurality of electrical lead wires, and a controller, wherein said electrostatic chuck comprises:

an insulating chuck body having a planar topmost surface; and an array of sensor-conductor assemblies embedded in said insulating chuck body and electrically insulated from one another, wherein each of said sensor-conductor assemblies includes an independently electrically biased conductive chuck element, a sensor configured to detect a substrate upon contact, and a motor that moves said sensor and said independently electrically biased conductive chuck element vertically, and wherein said controller is configured to generate a map of a distance between a top surface of said insulting chuck body and a bottom surface of said substrate at a location of each of said array of sensor-conductor assemblies by vertically moving said array of sensor-conductor assemblies until contact with said bottom surface of said substrate and by determining a time period between initiation of said vertically moving and said contact for each of said array of sensor-conductor assemblies.

8. The apparatus of claim 7, wherein an exposed surface of each independently electrically biased conductive chuck element within said sensor-conductor assemblies is provided with independent electrostatic bias with respect to said substrate and is configured to protrude above a topmost surface of said insulating chuck body when raised by said motor.

9. The apparatus of claim 7, wherein each independently electrically biased conductive chuck element within said sensor-conductor assemblies is configured to be coplanar with a topmost surface of said insulating chuck body when lowered by said motor.

10. The apparatus of claim 7, wherein said motor drives movement of said independently electrically biased conductive chuck element during a vertical movement of said sensor.

11. The apparatus of claim 7, further comprising a plurality of electrical lead wires that are electrically isolated from one another, wherein some of said plurality of electrical lead wires are configured to provide independent electrostatic bias to each of said independently electrically biased conductive chuck elements.

12. The apparatus of claim 11, wherein some others of said plurality of electrical lead wires are configured to transmit a detection signal to said controller when a sensor in a sensor-conductor assembly detects said substrate by proximity sensing or by contact.

13. The apparatus of claim 12, wherein said sensor and said independently electrically biased conductive chuck element are configured to move upward at a constant speed until said substrate is detected upon a command from said controller.

14. The apparatus of claim 13, wherein said controller is configured to transmit an electrostatic bias voltage that is determined as a function of a time period between a beginning of movement and an end of movement of said sensor to a independently electrically biased conductive chuck element within a same sensor-conductor assembly as said sensor.

15. The apparatus of claim 14, wherein said controller is configured to adjust said electrostatic bias voltage linearly with said time period.

16. The apparatus of claim 7, further comprising at least one motorized conductive chuck element configured to protrude above said planar topmost surface and to vertically move said substrate away from said topmost surface.

17. The apparatus of claim 7, further comprising a second electrostatic chuck spaced from said electrostatic chuck and said substrate, wherein said second electrostatic chuck is configured to bring said second substrate into physical contact with said substrate on said electrostatic chuck.

18. The apparatus of claim 17, wherein said second electrostatic chuck includes:

a second insulating chuck body having a second planar surface; and a second array of second sensor-conductor assemblies embedded in said second insulating chuck body and electrically insulated from one another, wherein each of said second sensor-conductor assemblies includes a second conductive chuck element, a second sensor configured to detect said second substrate upon contact, and a second motor that moves said second sensor vertically.

19. The apparatus of claim 1, wherein said array of independently electrically biased conductive chuck elements is configured so that exposed surfaces of said independently electrically biased conductive chuck elements are provided with independent electrical bias, are coplanar with said planar topmost surface of said insulating chuck body when lowered by said motors, and protrude above a topmost surface of said insulating chuck body when raised by said motors.

20. The apparatus of claim 1, wherein a respective lead wire of said plurality of electrical lead wires is electrically connected to a respective independently electrically biased conductive chuck element and is configured to provide independent electrostatic bias with respect to said substrate to said respective independently electrically biased conductive chuck element for flattening said substrate.

* * * * *